United States Patent [19]

Mueller

[11] 3,934,247

[45] Jan. 20, 1976

[54] ALPHANUMERIC DISPLAY MEANS FOR COMPUTER-LINKED TYPEWRITER CONSOLES USING A MATRIX ARRAY OF LIGHT-EMITTING DIODES (LED'S)

[75] Inventor: Thomas Delbert Mueller, Orinda, Calif.

[73] Assignee: Chevron Research Company, San Francisco, Calif.

[22] Filed: Nov. 5, 1973

[21] Appl. No.: 413,280

[52] U.S. Cl............ 340/324 R; 340/365 R; 340/380
[51] Int. Cl.² ............................................. G06F 3/14
[58] Field of Search ...... 340/324 RM, 378, 166 EL, 340/380

[56] References Cited
UNITED STATES PATENTS

| | | | |
|---|---|---|---|
| 3,644,922 | 2/1972 | James et al. | 340/380 |
| 3,670,322 | 6/1972 | Mallebrein | 340/365 C |
| 3,786,499 | 1/1974 | Jankowski et al. | 340/380 |

*Primary Examiner*—Marshall M. Curtis
*Attorney, Agent, or Firm*—R. L. Freeland, Jr.; H. D. Messner

[57] ABSTRACT

The present invention relates to an alphanumeric display unit means for improving the identification quantities at selected key buttons of a computer-linked typewriter console through usage of light-emitting identification indicia attached adjacent to or at the selected key buttons. Each light-emitting display is in matrix format consisting of a set of light-emitting diodes (LED's) arranged in orthogonal rows and columns. Energization of the LED's is by means of digital control circuitry. Result: a repetitive light-emitting display in matrix format in a configuration corresponding to an alphanumeric indicium for which display is sought.

2 Claims, 7 Drawing Figures

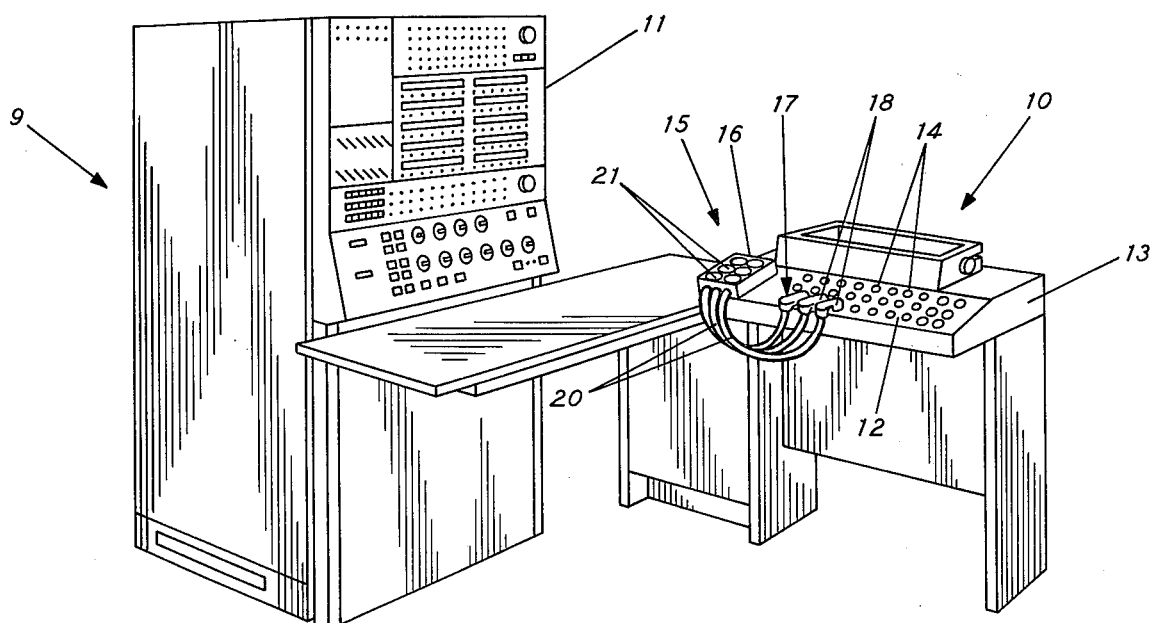
FIG. 1
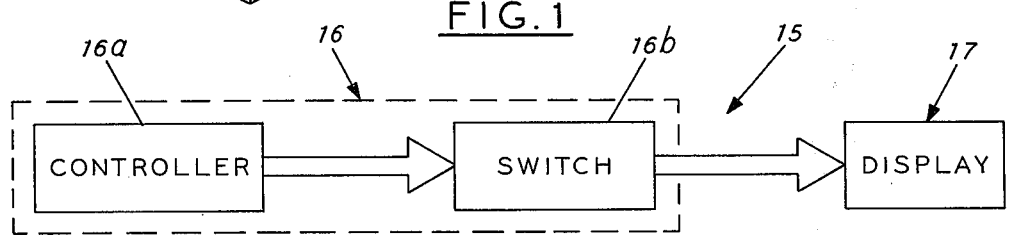
FIG. 2
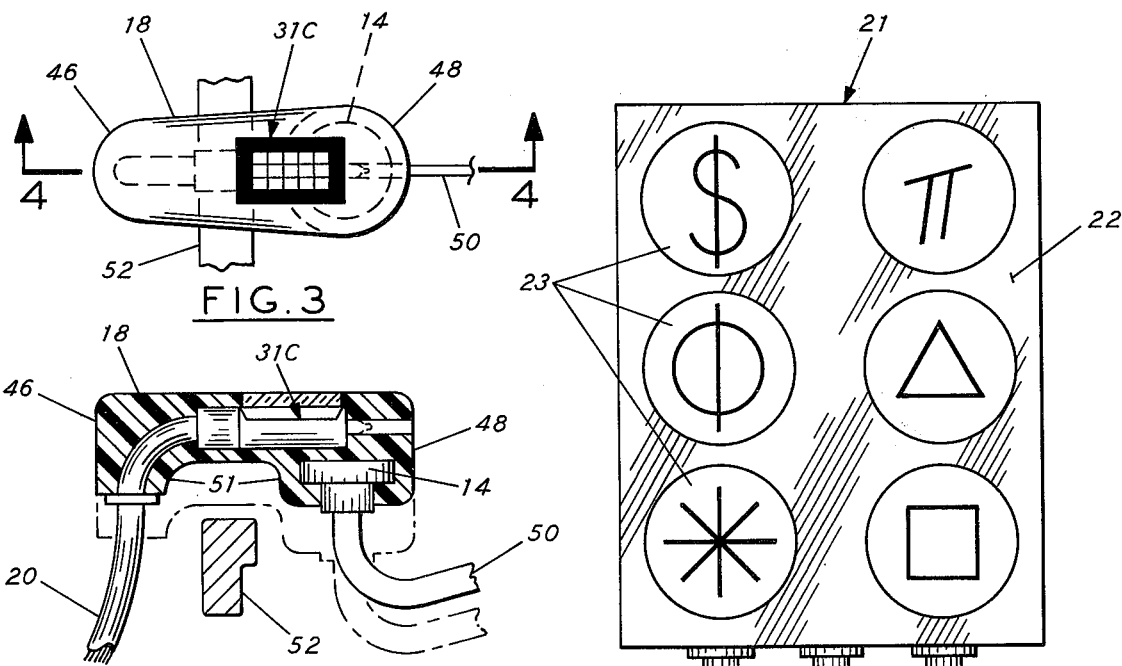
FIG. 3
FIG. 4
FIG. 5

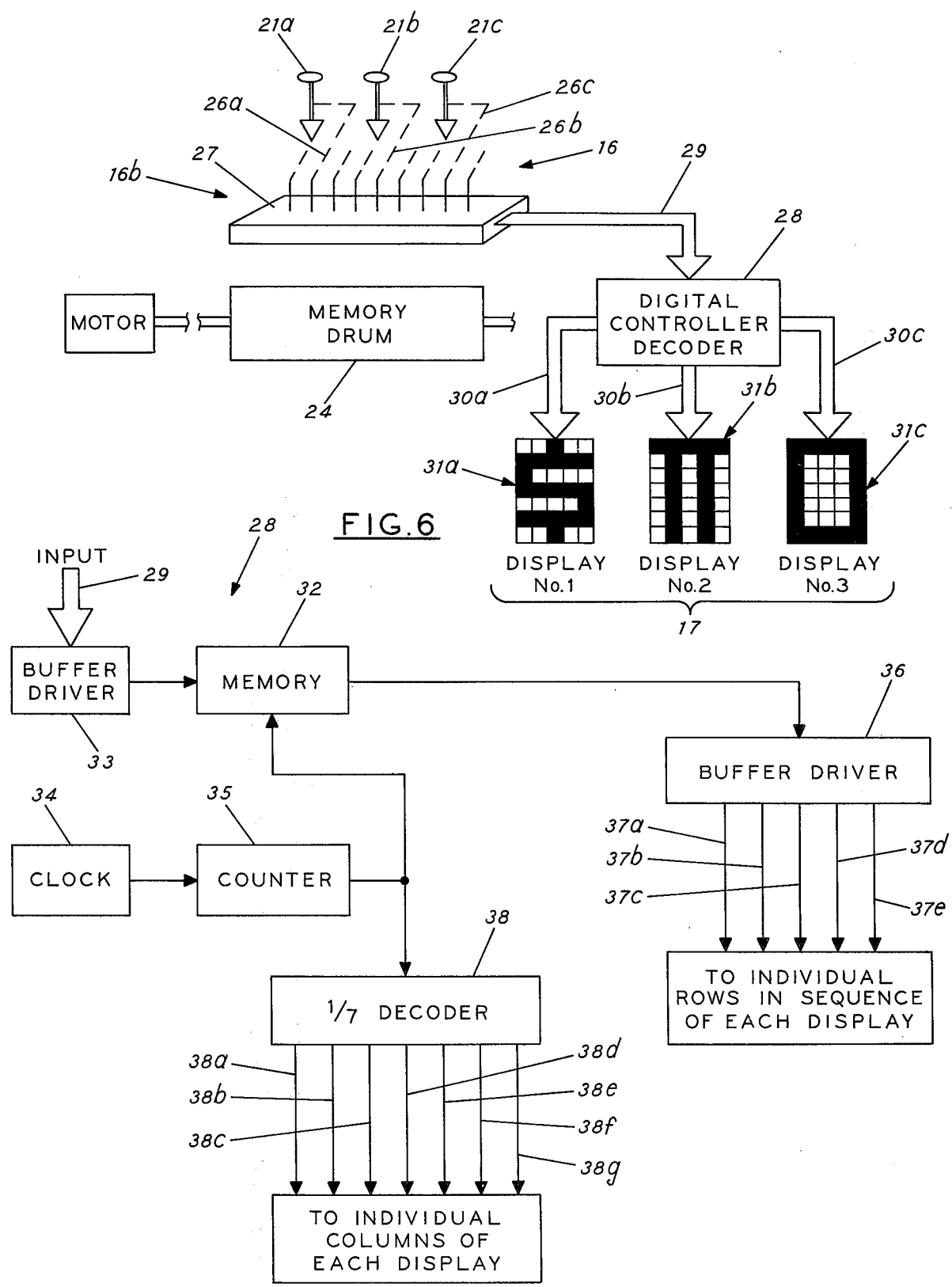

ALPHANUMERIC DISPLAY MEANS FOR COMPUTER-LINKED TYPEWRITER CONSOLES USING A MATRIX ARRAY OF LIGHT-EMITTING DIODES (LED'S)

FIELD OF THE INVENTION

The present invention relates to key-operated typographical machines such as typewriters and the like, and more particularly, to a computer-linked typewriter console used as an input/output (I/O) linkage for a general purpose digital computer.

BACKGROUND OF THE INVENTION

Today's different programming languages (FORTRAN, PL-1, ASSEMBLY, etc.) are often used interchangeably by operators at a common computer terminal for controlling a general purpose digital computer. The number, symbols and programming keys associated with a given programming language may require any one operator to alternate a plurality of fonts at the computer-linked typewriter console; however, as is well known, each font relates to a different layout of keyboard characters.

As font changes occur, it has been proposed to employ key buttons, each bearing a plurality of characters to aid the observer-user in more efficiently using the typewriter console. It has been further proposed to fit the key buttons with adjustable plates bearing different character indicia. However, where there are a plurality of operators-users at a common typewriter console such as found at most computer terminals, numerous alphanumeric identification plates would be needed. Therefore, the above-mentioned proposals have been found to be exceedingly awkward to implement. Also, in some cases it is desirable to "highlight" certain key buttons above those displayed at adjacent buttons owing to the importance of certain programming keys being implemented at the computer terminal. None of the prior art plates provides such features.

SUMMARY OF THE INVENTION

In accordance with the present invention, selected keyboard buttons of an I/O typewriter console linked to a general purpose digital computer are provided with a plurality of tightly fitting rigid tab frame means. Onto the frame means are fitted a highly visible, light-emitting alphanumeric display means for display of key alphanumeric indicia through selective control provided by controller switch means connected thereto. Preferably the light-emitting display means includes display array matrices of sets of light-emitting semiconductor diodes (LED's), each matrix being arranged in orthogonal columns and rows at the surface of one of the frame means visible to the observer-user. Energization of the LED's is by means of digital control circuitry which provides sets of matrix binary codes, each set including a series of row and column control subcodes for selectively energizing orthogonal row and column conductors connected to predetermined LED's. Result: a pattern of light corresponding to the alphanumeric indicium for which display is sought. By recycling ("refreshing") the energization code activated with a given matrix above the flicker fusion rate of the human eye, the resulting alphanumeric display appears as a solid image to the observer-user.

OBJECTS OF THE INVENTION

An object of the present invention is the provision of a novel, light-emitting alphanumeric display for use at a typewriter console linked to a general purpose digital computer whereby the observer-user of the typewriter console can easily identify key lever operations irrespective of the number and/or programming language employed within the linked digital computer or at the I/O typewriter console itself.

Further objects of the invention will become apparent from a detailed description of the single embodiment given by way of example and not by way of limitation, reference being made to the accompanying drawings.

DESCRIPTION OF THE DRAWINGS

FIG. 1 is a perspective view of an I/O computer terminal which includes a typewriter console having a keyboard provided with light-emitting, alphanumeric character displays positioned at selected key buttons in accordance with the present invention;

FIG. 2 is a schematic diagram of general circuitry useful in the apparatus of the present invention;

FIG. 3 is a plan view of a tab frame means attached to a selected key button of the typewriter console of FIG. 1;

FIG. 4 is a section taken along line 4—4 of FIG. 3;

FIG. 5 is a plan view of an array of switch buttons useful in initializing circuit components within the apparatus of the present invention;

FIG. 6 is a schematic diagram of digital control circuitry useful in the apparatus of the present invention; and FIG. 7 is a detail schematic diagram of a digital controller-decoder useful in carrying out the present invention.

DESCRIPTION OF A DETAILED EMBODIMENT

FIG. 1 illustrates a computer terminal 9. The computer terminal 9 includes an I/O typewriter console 10 useful in linking digital information to a general purpose digital computer (not shown). Information can be linked to the computer by I/O devices other than the typewriter console 10. For this purpose, such associated I/O devices can be housed within cabinet 11.

Typewriter console 10 is seen to comprise a keyboard 12 visible above housing 13. The observer-user utilizes key buttons 14 to depress levers (not shown) by which conventional font-paper interaction occurs while, simultaneously, the data is transmitted, after being compiled, to the general purpose digital computer. Keyboard 12 is conventionally arranged; e.g. as a series of rows and columns. Due to the fact that different programming languages used by various observer-users for computer control purposes may employ numerous characters, symbols and keys not readily interrelated, there is a definite need for identification means for attachment to selected key buttons 14. Preferably such identification means should highlight the display irrespective of the background lighting environment at the computer terminal 9. The present invention provides for such a display through a novel, light-emitting display unit 15 attached to the typewriter console 10. In general, the display unit 15 comprises a controller switch unit 16 attached, say, to the housing 13 of the typewriter console 10, and an alphanumeric indicating unit 17 including a rigid frame means 18. Also of importance: transfer bundle means 20 connected between the controller switch unit 16 and the indicating unit 17. Each of the aforementioned elements will now be described in detail.

Controller Switch Unit 16

As FIG. 1 illustrates, controller switch unit 16 should be placed within arm's length of an observer-user seated at the typewriter console 10. To the broad horizontal surface of the unit are attached a series of buttons 21. Purpose: to effectuate control of the indicating unit 17 through digital controller 16a (FIG. 2) operating in conjunction with switch unit 16b, as explained in detail below.

FIG. 5 illustrates the arrangement of buttons 21 in more detail. As shown, they are arranged as a matrix array comprising a series of orthogonal columns and rows, with each top, broad surface extending well above the support housing 22. Tags 23 are attached to the aforementioned broad surfaces of the buttons so as to allow easy identification to the observer-user. Operation of the buttons is staightforward: downward movement will cause switch elements (not shown) to change their operational state. As a result, initialization operations within the controller switch unit 16, as discussed below, occur.

FIGS. 6 and 7 illustrate controller switch unit 16 in more detail.

With specific reference to FIG. 6, assume binary control-bit data has been encoded onto memory drum 24 as bit-channels, say under control of the buttons 21a, 21b and 21c in conjunction with read-write head unit 27. Each bit-channel comprises a binary code of bit information associated with a selected button 21a, 21b or 21c. For decoding purposes, assume that buttons 21a, 21b, and 21c have undergone downward movement so as to change states of switch elements of the switch unit generally indicated at 16b in FIG. 6 through operation of mechanical linkages 26a, 26b and 26c. As a result, three channels of binary data —initialization codes— are read into digital controller-decoder 28 via transfer line 29. Purpose of the initialization codes: to provide the digital controller-decoder 28 with switch control information through which it can generate via transfer lines 30a, 30b and 30c sets of binary matrix codes. Ultimately, these codes are used to generate a light pattern corresponding to alphanumeric indicium for which display is being sought at display array matrices 31a, 31b or 31c constituting the indicating unit 17.

FIG. 7 illustrates digital controller-decoder 28 in more detail.

As shown, operations are initiated by the sets of initialization codes being read into memory unit 32 via the transfer line 29 through buffer driver 33. Synchronization of operations is paced by timing signals generated by master clock 34. In series with clock 34 is counter 35 having an output also connected to the memory unit 32. In operation, binary codes previously read into the memory unit 32 are first fetched from the latter through command signals generated by clock 34 and counter 35; the binary codes then pass through buffer-driver 36 to terminals 37a–37e. Similar command signals pass from the clock 34 and counter 35 to one-in-seven decoder 38 having a series of output terminals 38a–38g. The binary state (ONE, ZERO) of the subcodes at each terminal 37a–37e and 38a–38g determines display characteristics at each display matrices 31a, 31b or 31c of FIG. 6, as explained in detail below. The activation code at the terminals 37a–37e not only relates to columnar matrix activation of each display matrix 31 a, 31b or 31c but also may contain certain control bit information; thus the resulting subcode can be called a "columnar control subcode." Likewise, the subcode passing from terminals 38a–38g of one-in-seven decoder 38 controls row matrix activation of each display matrix; thus such subcode can be called a "row control subcode." Together, these subcodes provide sets of matrix binary codes at each of the display array matrices 31a, 31b or 31c of FIG. 6.

Operations of the digital controller-decoder 28 will now be explained with reference to FIGS. 6 and 7.

For simplicity of discussion, assume that the desired alphanumeric indicia at matrix displays 31a, 31b and 31c are as depicted in FIG. 6. Also assume that each matrix display 31a, 31b and 31c is composed of a semiconductor set of light-emanating diodes (LED's), each matrix being arranged in a series of orthogonal columns and rows, and being addressable by energization of selected row and columnar conductors via the matrix binary codes previously mentioned. Since each LED is defined by an individual row and column intersection of conductors, it can be enabled by the ONE condition of the intersecting columnar and row subcodes, i.e., a ONE bit condition of each conductor line. For example, for the diplay indicia depicted in FIG. 6, i.e., at displays 31a, 31b, 31c columnar subcodes are as set forth in Table I below, such subcodes assuming columnar activation proceeds from left to right in each display and row activation proceeds from top to bottom, as viewed:

TABLE I

| Matrix Display 31a Columns | | | | | | Matrix Display 31b Columns | | | | | | Matrix Display 31c Columns | | | | |
|---|---|---|---|---|---|---|---|---|---|---|---|---|---|---|---|---|
| 1 | 2 | 3 | 4 | 5 | | 1 | 2 | 3 | 4 | 5 | | 1 | 2 | 3 | 4 | 5 |
| Rows | | | | | | Rows | | | | | | Rows | | | | |
| 1 | 0 | 0 | 1 | 0 | 0 | 1 | 1 | 1 | 1 | 1 | 1 | 1 | 1 | 1 | 1 | 1 |
| 2 | 1 | 1 | 1 | 1 | 1 | 2 | 0 | 1 | 0 | 1 | 0 | 2 | 1 | 0 | 0 | 0 | 1 |
| 3 | 1 | 0 | 0 | 0 | 0 | 3 | 0 | 1 | 0 | 1 | 0 | 3 | 1 | 0 | 0 | 0 | 1 |
| 4 | 1 | 1 | 1 | 1 | 1 | 4 | 0 | 1 | 0 | 1 | 0 | 4 | 1 | 0 | 0 | 0 | 1 |
| 5 | 0 | 0 | 0 | 0 | 0 | 5 | 0 | 1 | 0 | 1 | 0 | 5 | 1 | 0 | 0 | 0 | 1 |
| 6 | 1 | 1 | 1 | 1 | 1 | 6 | 0 | 1 | 0 | 1 | 0 | 6 | 1 | 0 | 0 | 0 | 1 |
| 7 | 0 | 0 | 1 | 0 | 0 | 7 | 0 | 1 | 0 | 1 | 0 | 7 | 1 | 1 | 1 | 1 | 1 |

In this regard, as the one-in-seven decoder 38 of FIG. 7 selects the row for activation, the buffer-driver 36 provides the correct enablement pattern to the columns of conductors. For example, for row No. 1 of the display matrix 31a of Table I, decoder 38 would initially generate the following row columnar subcode: 1 0 0 0 0 0. Simultaneously, the buffer driver 36 would provide the following columnar control subcode at terminals 37a–37e: 00100. As a result, only one LED in the above row-column intersection would be enabled.

By recycling the subcodes at a rate well above the flicker fusion frequency of the human eye, i.e., above 30 cycles per second, however, the image of the display would appear as a solid alphanumeric pattern to the human observer-user.

Indicating Unit 17

Indicating unit 17 is illustrated in detail in FIGS. 3 and 4.

As previously described, the transfer bundle means 20 is composed of sets of conductors for activation of the LED display array matrices, one of which being indicated at 31c in FIGS. 3 and 4. Support of the LED array matrix 31c is through the rigid frame means 18 previously mentioned. The frame means 18 includes a cantilevered end 46 and a support end 48. The support end 48 attaches to a selected key button 14 as shown in FIG. 4. Over the central region of the frame 18 there is a reduction in thickness to form steps 51. In that way when the keyboard button 14 is depressed whereby key lever 50 is likewise downwardly depressed, there is sufficient clearance of these elements with regard to lip 52 of the typewriter housing.

The LED display matrix 31c is arranged in a matrix format composed of sets of orthogonal rows and columns of LED's of sufficient size for alphanumeric display, say a 7 × 5 matrix. Since the generated alphanumeric display at each display matrix is illuminated by light provided by individual LED's, the observer-user can easily observe the displayed character irrespective of the background lighting at the computer terminal.

Light emission properties of semicondutor LED's comprising the matrix displays of the present invention are well known and need not be discussed in great detail. Suffice to say that optimum materials for the diodes should be selected, say gallium arsenide, gallium phosphide crystals. Likewise, the carrier substrate should be of any suitable material that permits monocrystalline epitaxial growth.

While certain perferred embodiments of the invention have been specifically disclosed, it should be understood that the invention is not limited thereto. For example, if the dimensions of the LED display matrix 31c are reduced, the supporting housing within each key button 14 may be sufficient to support the former. In such an arrangement, a selected key button 14 would be provided with a bore which would then accept a display array matrix. The resulting end array would be directly viewable by the observer-user. Accordingly, as many variations will be readily apparent by those skilled in the art, the invention should be given as broad as possible interpretation in terms of the following claims.

I claim:
1. A device for displaying alphanumeric light-emanating indicia at selected key buttons of a keyboard of a typewriter console forming an I/O link with a general-purpose digital computer, each light-emanating alphanumeric indicium being related to a font operational characteristic resulting from movement of one of said selected key buttons under control of a human observer-user whereby said font operational characteristic is permanently recorded on paper at said typewriter console in full view of said human observer-user through mechanical button-font-paper interaction, comprising
   a. semiconductor, light-emitting diode means arranged to display at or adjacent to at least one of said selected key buttons said light-emanating alphanumeric indicium associated with said font operational characteristic;
   b. cantilevered elongated rigid frame means attached to and supportive of said light-emitting diode means, said frame means including cooperative means in gripping contact with corresponding one or more key buttons of said keyboard;
   c. controller switch means connected to said light-emitting diode means and including digital controller-decoder means for repetitively generating binary activation codes for said diode means at a rate sufficiently above the flicker fusion rate of the human eye to display said desired alphanumeric display indicium as a solid image to said observer-user, said displayed indicium being of sufficient intensity so as to be easily discernible to said human observer-user using said typewriter console irrespective of the background of lighting environment thereabout.

2. Device of claim 1 in which said light-emitting diode means is supported interior of said one key button of said keyboard viewable at the finger-touching surface of said one key button.

* * * * *